US011445647B2

(12) United States Patent
Huang et al.

(10) Patent No.: US 11,445,647 B2
(45) Date of Patent: Sep. 13, 2022

(54) EXTERNAL ELECTROMAGNETIC SHIELDING DEVICE

(71) Applicant: ADIVIC TECHNOLOGY CO., LTD, Taoyuan (TW)

(72) Inventors: Hsieh-Sheng Huang, Taoyuan (TW); Pei-Yan Lin, Taoyuan (TW); Chao-Fa Yang, Taoyuan (TW)

(73) Assignee: ADIVIC TECHNOLOGY CO., LTD, Taoyuan (TW)

( * ) Notice: Subject to any disclaimer, the term of this patent is extended or adjusted under 35 U.S.C. 154(b) by 0 days.

(21) Appl. No.: 17/321,687

(22) Filed: May 17, 2021

(65) Prior Publication Data

US 2022/0240424 A1 Jul. 28, 2022

(30) Foreign Application Priority Data

Jan. 27, 2021 (TW) .................................. 110102938

(51) Int. Cl.
*H05K 9/00* (2006.01)
*G01R 1/18* (2006.01)

(52) U.S. Cl.
CPC ............. *H05K 9/0086* (2013.01); *G01R 1/18* (2013.01); *H05K 9/0001* (2013.01)

(58) Field of Classification Search
CPC ........... H05K 9/0001; G01R 1/04; G01R 1/18
See application file for complete search history.

(56) References Cited

U.S. PATENT DOCUMENTS

| 3,390,491 | A | * | 7/1968 | Hayden | ................ | H05K 9/0001 52/2.25 |
| 4,785,136 | A | * | 11/1988 | Mollet | ................... | H05K 9/009 174/386 |
| 5,908,043 | A | * | 6/1999 | Paes | ......................... | E04B 1/92 135/117 |
| 6,140,576 | A | * | 10/2000 | Kanne | ................... | H05K 9/0001 442/131 |
| 8,872,042 | B2 | * | 10/2014 | Cordes | ................ | H05K 9/0001 52/2.18 |
| 10,876,288 | B2 | * | 12/2020 | Shibuya | .................... | E04B 1/92 |
| 2003/0198800 | A1 | * | 10/2003 | Hoffman | ................ | H01Q 17/00 428/323 |
| 2004/0006267 | A1 | * | 1/2004 | Buchanan | ............ | G01R 33/025 600/409 |

(Continued)

*Primary Examiner* — Hung V Ngo

(74) *Attorney, Agent, or Firm* — Li & Cai Intellectual Property (USA) Office

(57) ABSTRACT

An external electromagnetic shielding device is provided. The external electromagnetic shielding device includes a bottom shield, a conductive cover being in a grid-like shape and arranged above the bottom shield, and a rolling module. The conductive cover includes a top shield spaced apart from the bottom shield, a lateral shield connected to the top shield, and a plurality of supports that are fixed to the lateral shield. The supports include a bottom support in an annular arrangement, and any two of the supports are spaced apart from each other. The rolling module includes a rolling unit and a linkage unit that is connected to the rolling unit and the bottom support. When the linkage unit is coiled on or released from the rolling unit, the bottom support can be moved to allow the lateral shield to fold or unfold between the bottom shield and the top shield.

15 Claims, 13 Drawing Sheets

(56) References Cited

U.S. PATENT DOCUMENTS

| | | | | |
|---|---|---|---|---|
| 2014/0020946 A1* | 1/2014 | Winch | ............... | H05K 9/0015 |
| | | | | 174/353 |
| 2015/0014048 A1* | 1/2015 | Harrison | ............. | H05K 9/0075 |
| | | | | 228/110.1 |
| 2017/0365365 A1* | 12/2017 | White | ..................... | H05K 9/00 |
| 2018/0027706 A1* | 1/2018 | Winch | ............... | H05K 9/0003 |
| | | | | 174/382 |
| 2019/0307026 A1* | 10/2019 | Babhadiashar | ...... | H05K 9/0003 |

\* cited by examiner

EXTERNAL ELECTROMAGNETIC SHIELDING DEVICE

CROSS-REFERENCE TO RELATED PATENT APPLICATION

This application claims the benefit of priority to Taiwan Patent Application No. 110102938, filed on Jan. 27, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a shielding device, and more particularly to an external electromagnetic shielding device.

BACKGROUND OF THE DISCLOSURE

A conventional test system is provided with an electromagnetic shielding structure therein, but the electromagnetic shielding structure is only used to electromagnetically shield a part of the conventional test system, so that the conventional test system in operation cannot avoid being affected by an external electromagnetic interference. For example, in the past, a conventional semiconductor integrated circuit (IC) test equipment is used to test a device under test (DUT) without consideration for external electromagnetic waves, but a test environment stability, a test accuracy, a test efficiency, and a test cost need to be considered in a test environment for a 5G IC chip (containing a millimeter wave frequency band).

SUMMARY OF THE DISCLOSURE

In response to the above-referenced technical inadequacies, the present disclosure provides an external electromagnetic shielding device to effectively improve on the issues associated with electromagnetic shield structures in conventional test systems.

In one aspect, the present disclosure provides an external electromagnetic shielding device for being disposed outside of a test system. The external electromagnetic shielding device includes a bottom shield, a conductive cover, and a rolling module. The bottom shield is configured to be arranged under a bottom of the test system. The conductive cover is in a grid-like shape and is arranged above the bottom shield. The conductive cover includes a top shield, a lateral shield, and a plurality of supports. The top shield is spaced apart from the bottom shield along a height direction by a distance. The lateral shield is connected to the top shield. The lateral shield, the top shield, and the bottom shield jointly define an electromagnetic shielding space. The supports are fixed to the lateral shield. The supports include a bottom support being in an annular arrangement, and any two of the supports are spaced apart from each other along the height direction. The rolling module includes a rolling unit and a linkage unit that is connected to the rolling unit and the bottom support. When the linkage unit is coiled on or released from the rolling unit, the linkage unit moves the bottom support so as to allow the lateral shield to fold or unfold between the bottom shield and the top shield along the height direction.

In another aspect, the present disclosure provides an external electromagnetic shielding device, which includes a bottom shield, a conductive cover, and a rolling module. The conductive cover is in a grid-like shape and is arranged above the bottom shield. The conductive cover includes a top shield, a lateral shield, and a bottom support. The top shield is spaced apart from the bottom shield along a height direction by a distance. The lateral shield is connected to the top shield. The lateral shield, the top shield, and the bottom shield jointly define an electromagnetic shielding space. The bottom support is fixed to the lateral shield and is in an annular arrangement. The rolling module includes a rolling unit and a linkage unit that is connected to the rolling unit and the bottom support. When the linkage unit is coiled on or released from the rolling unit, the linkage unit moves the bottom support so as to allow the lateral shield to fold or unfold between the bottom shield and the top shield along the height direction.

Therefore, the external electromagnetic shielding device in the present disclosure is configured to be disposed outside of the test system, thereby achieving a complete electromagnetic shielding effect to the test system. Moreover, the conductive cover of the external electromagnetic shielding device is in the grid-like shape to effectively maintain a heat dissipation efficiency of the test system and to avoid affecting the operation of the test system.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

First Embodiment

Figure 1:
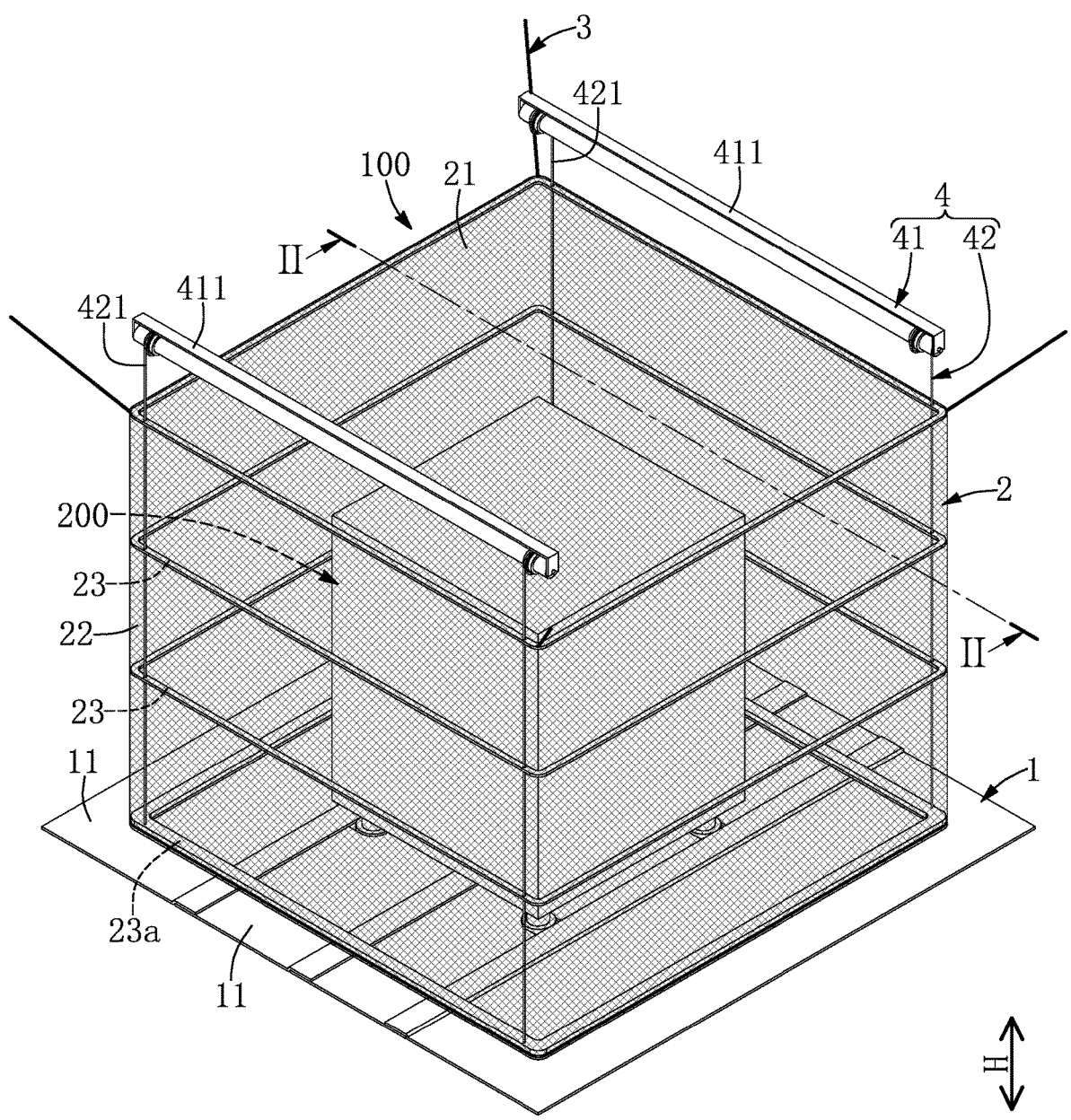
FIG. 1 is a perspective view of an external electromagnetic shielding device disposed outside of a test system according to a first embodiment of the present disclosure.
Figure 2:
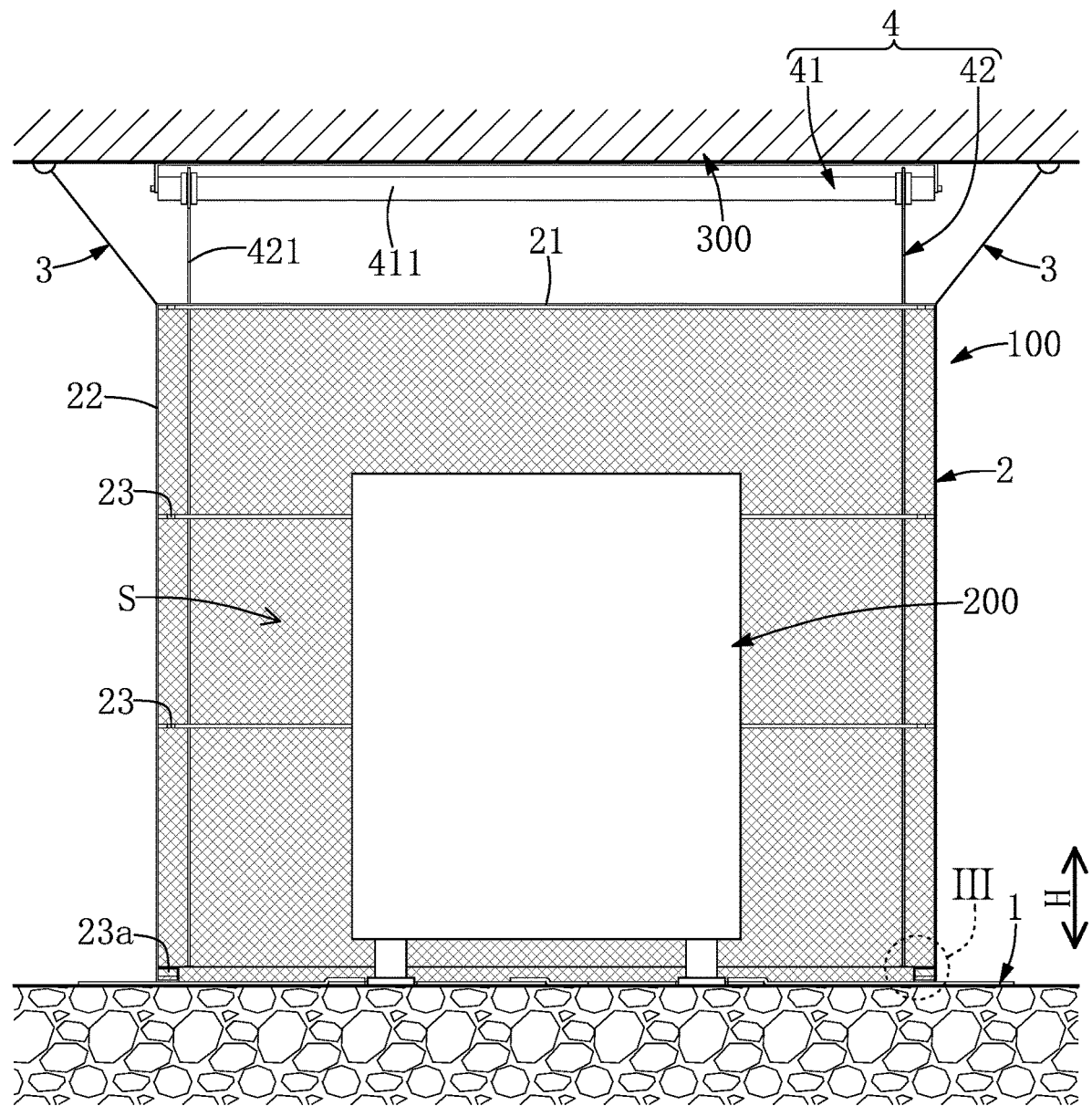
FIG. 2 is a cross-sectional view taken along line II-II of FIG. 1.
Figure 3:
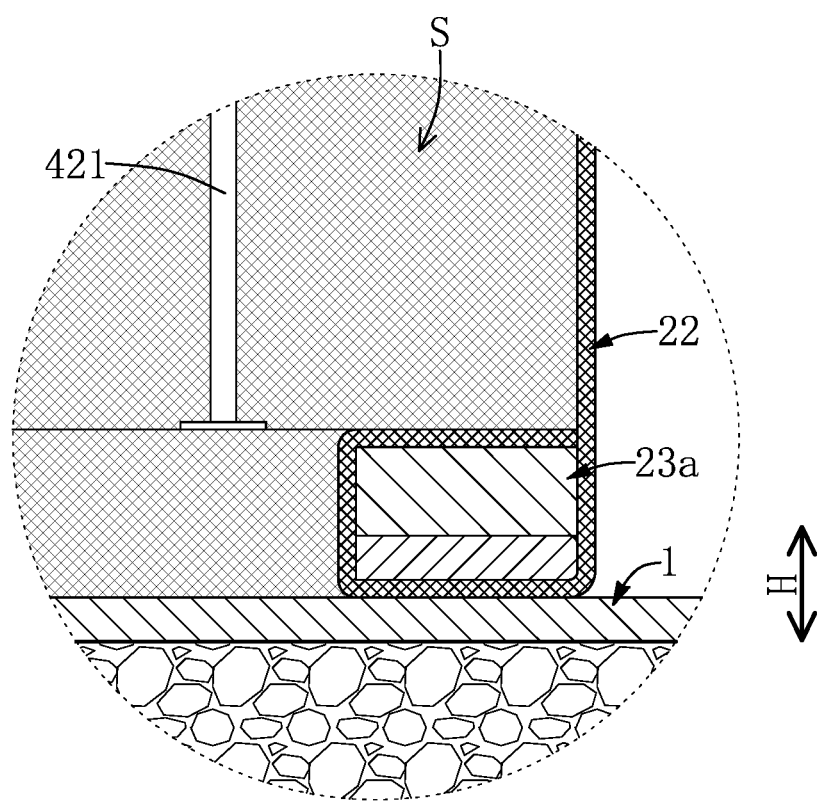
FIG. 3 shows an enlarged view of part III of FIG. 2.

Referring to FIG. 1 to FIG. 6, a first embodiment of the present disclosure provides an external electromagnetic shielding device 100. As shown in FIG. 1 to FIG. 3, the external electromagnetic shielding device 100 is configured to be disposed outside of a test system 200. It should be noted that the external electromagnetic shielding device 100 in the present embodiment is directly disposed outside of the test system 200 without moving the test system 200, so that the test system 200 can be entirely surrounded by the external electromagnetic shielding device 100 for having an electromagnetic shielding effect.

The external electromagnetic shielding device 100 in the present embodiment includes a bottom shield 1, a conductive cover 2 (or an electrically conductive cover 2) arranged above the bottom shield 1, a hanging module 3 connected to the conductive cover 2, and a rolling module 4 that is assembled to the conductive cover 2.

It should be noted that the external electromagnetic shielding device 100 in the present embodiment is described by including the above components, but the present disclosure is not limited thereto. For example, in other embodiments of the present disclosure not shown in the drawings, the hanging module 3 can be omitted or can be replaced by other components. The following description describes the structure and connection relationship of each component of the external electromagnetic shielding device 100.

The bottom shield 1 is configured to be arranged under a bottom of the test system 200, thereby preventing the test system 200 from being affected by a signal traveled from the bottom of the test system 200. In the present embodiment, the bottom shield 1 can be an aluminum foil that is not in a grid-like shape, but the present disclosure is not limited thereto. Moreover, the bottom shield 1 corresponds in size to the test system 200. For example, a projection region defined by orthogonally projecting the test system 200 onto the bottom shield 1 along a height direction H is located inside of a peripheral edge of the bottom shield 1.

Specifically, the bottom shield 1 includes a plurality of splicing sheets 11 that are spliced together to form the bottom shield 1, and any two of the splicing sheets 11 adjacent to each other preferably partially overlap, so that the splicing sheets 11 can be detachably arranged under the bottom of the test system 200. Accordingly, the splicing sheets 11 partially overlapped with each other can provide a complete electromagnetic shielding effect to the bottom of the test system 200.

In other words, since any two of the splicing sheets 11 adjacent to each other partially overlap, the bottom shield 1 can be provided without any gap along the height direction H, but the present disclosure is not limited thereto. For example, in other embodiments of the present disclosure not shown in the drawings, the splicing sheets 11 of the bottom shield 1 can be provided without being overlapped with one another; or, the bottom shield 1 can also be a single one piece structure.

The conductive cover 2 is in a grid-like shape, and a mesh number of the conductive cover 2 in the present embodiment is within a range from 20 to 500, so that air inside and outside of the conductive cover 2 can circulate to improve a heat dissipation efficiency of the test system 200. The conductive cover 2 can be a copper mesh, but the present disclosure is not limited thereto. For example, in other embodiments of the present disclosure not shown in the drawings, the conductive cover 2 can also be a conductive cloth or a metal mesh other than the copper mesh.

Specifically, the conductive cover 2 includes a top shield 21, a lateral shield 22 connected to the top shield 21 (e.g., a peripheral edge of the top shield 21), and a plurality of supports 23 that are fixed to the lateral shield 22. In the present embodiment, the hanging module 3 is connected to the top shield 21 so as to allow the conductive cover 2 to be hung at a predetermined position through the hanging module 3. For example, the hanging module 3 can include a plurality of ropes respectively fixed to different portions of the top shield 21, so as to hang the conductive cover 2 onto a ceiling 300 for facilitating a space above the test system 200, but the present disclosure is not limited thereto.

The top shield 21 is spaced apart from the bottom shield 1 along the height direction H by a distance that is greater than a height of the test system 200, and the top shield 21 corresponds in size to the test system 200. For example, a projection region defined by orthogonally projecting the test system 200 onto the top shield 21 along the height direction H is located inside of the peripheral edge of the top shield 21.

Moreover, the shape of the peripheral edge of the top shield 21 is identical to the shape of a cross section of the lateral shield 22 perpendicular to the height direction H, and the shape of the peripheral edge of the top shield 21 in the present embodiment is rectangle, but the present disclosure is not limited thereto. The lateral shield 22, the top shield 21, and the bottom shield 1 jointly define an electromagnetic shielding space S, and the test system 200 is arranged in the electromagnetic shielding space S.

Each of the supports 23 is in an annular arrangement, the supports 23 are preferably disposed at an inner side of the lateral shield 22, and any two of the supports 23 are spaced apart from each other along the height direction H. The annular arrangement in the present embodiment means that any one of the supports 23 can be a plurality of strips arranged in an annular shape, or can be a single one piece annular structure. In addition, the supports 23 can be made of different materials (e.g., aluminum, iron, or other materials).

Moreover, in order to clearly describe the present embodiment, the support 23 arranged adjacent to the bottom shield 1 in the present embodiment is defined as a bottom support 23a. The bottom support 23a is preferably surrounded by a bottom portion of the lateral shield 22 and is configured to be magnetically connected to the bottom shield 1, so that the bottom shield 1 and the bottom portion of the lateral shield 22 are commonly grounded by being connected to each other. For example, the bottom support 23a includes a plurality of metal strips and a plurality of magnets that are respectively fixed to the metal strips, so that the magnets can be magnetically connected to the bottom shield 1, but the present disclosure is not limited thereto.

The rolling module 4 includes a rolling unit 41 and a linkage unit 42 that is connected to the rolling unit 41 and the bottom support 23a. In the present embodiment, the rolling unit 41 includes a plurality of rollers 411, and the linkage unit 42 includes a plurality of cords 421 (e.g., nylon cords) respectively coiled on the rollers 411. The rollers 411 and the hanging module 3 can be fastened to a same carrier (e.g., the ceiling 300), the cords 421 can pass through the inner side of the lateral shield 22, and ends of the cords 421 away from the rollers 411 are respectively fixed to different regions of the bottom support 23a.

Figure 4:
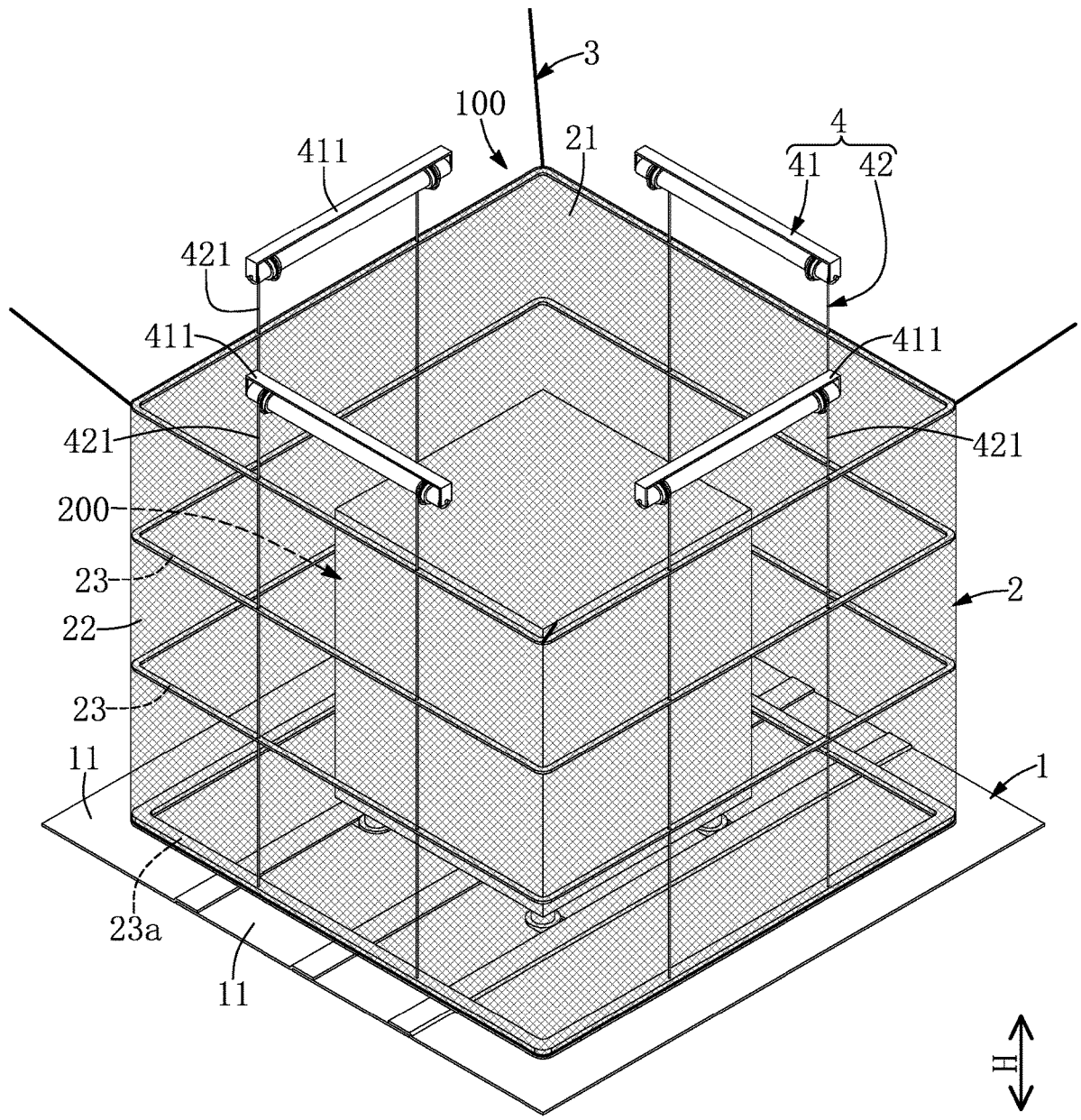
FIG. 4 is a perspective view showing the external electromagnetic shielding device in another configuration according to the first embodiment of the present disclosure.

Specifically, a quantity of the rollers 411 of the rolling unit 41 can be two (as shown in FIG. 1), and the linkage unit 42 is a corresponding structure; or, a quantity of the rollers 411 of the rolling unit 41 can be four (as shown in FIG. 4), and the linkage unit 42 is a corresponding structure, but the present disclosure is not limited thereto. For example, in other embodiments of the present disclosure not shown in the drawings, a quantity of the rollers 411 of the rolling unit 41 can be at least one, and a quantity of the cords 421 of the linkage unit 42 can be at least one.

Figure 5:
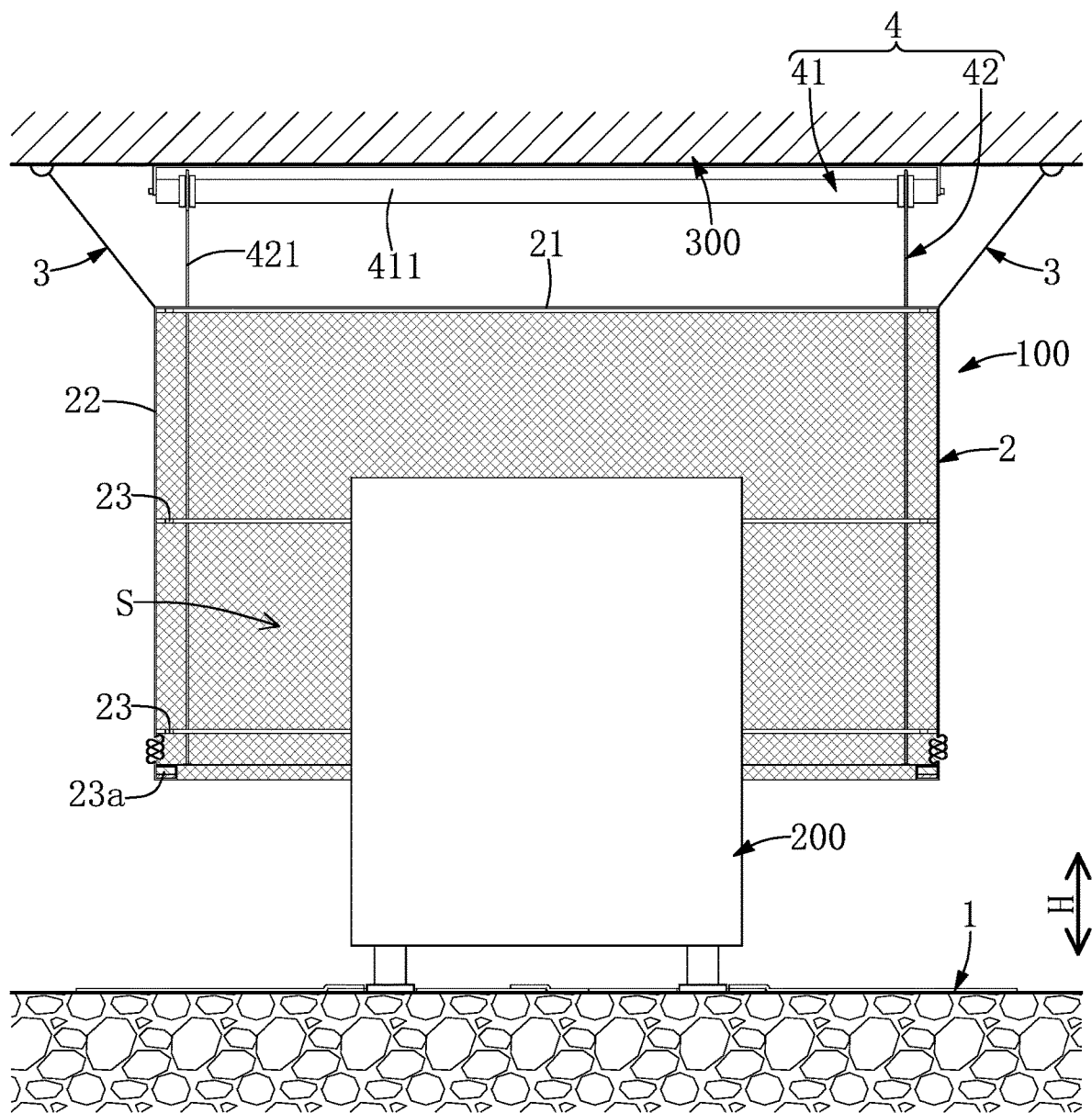
FIG. 5 and FIG. 6 are cross-sectional views showing a conductive cover of FIG. 2 being coiled.
Figure 6:
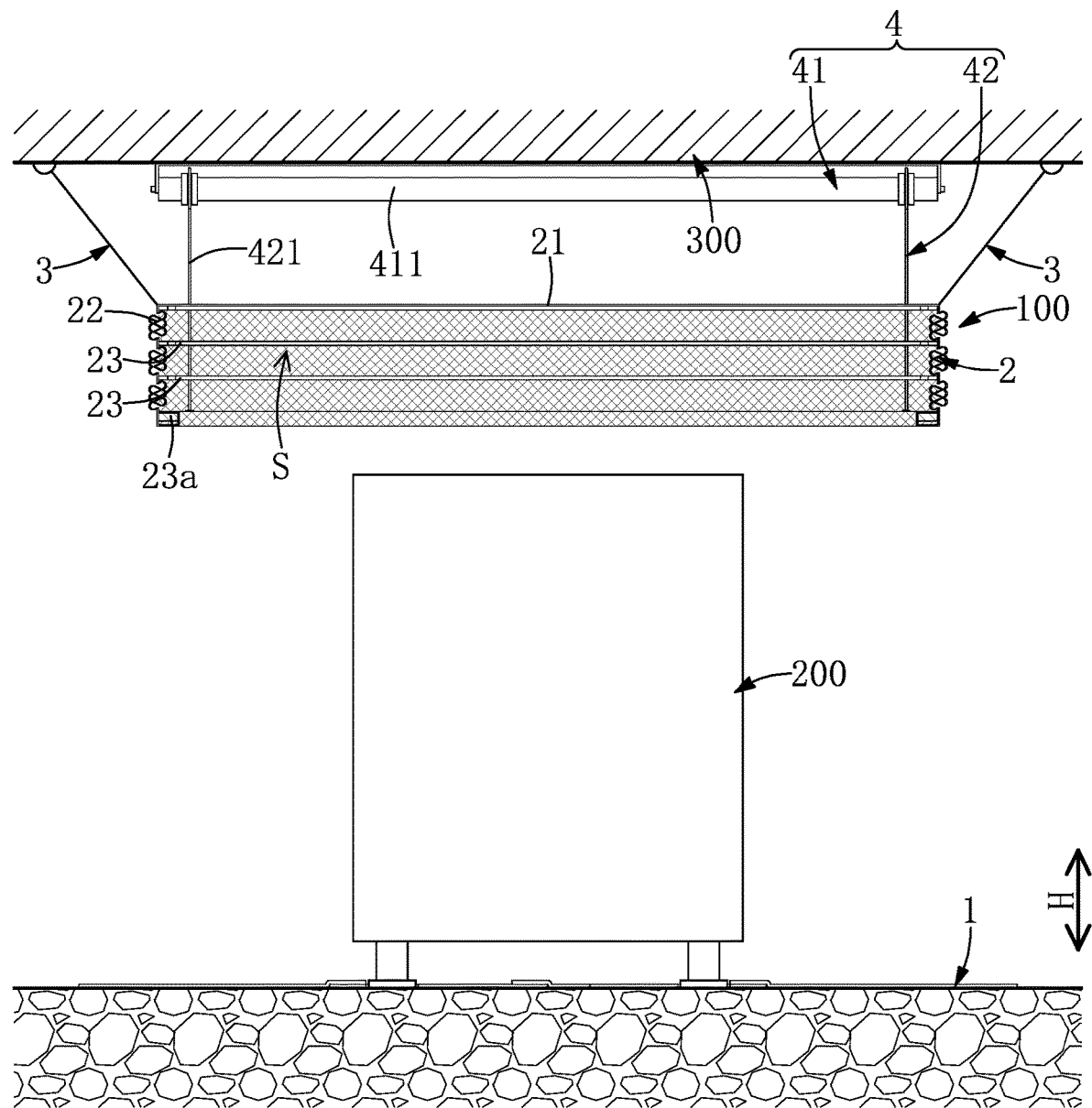
Figure 7:
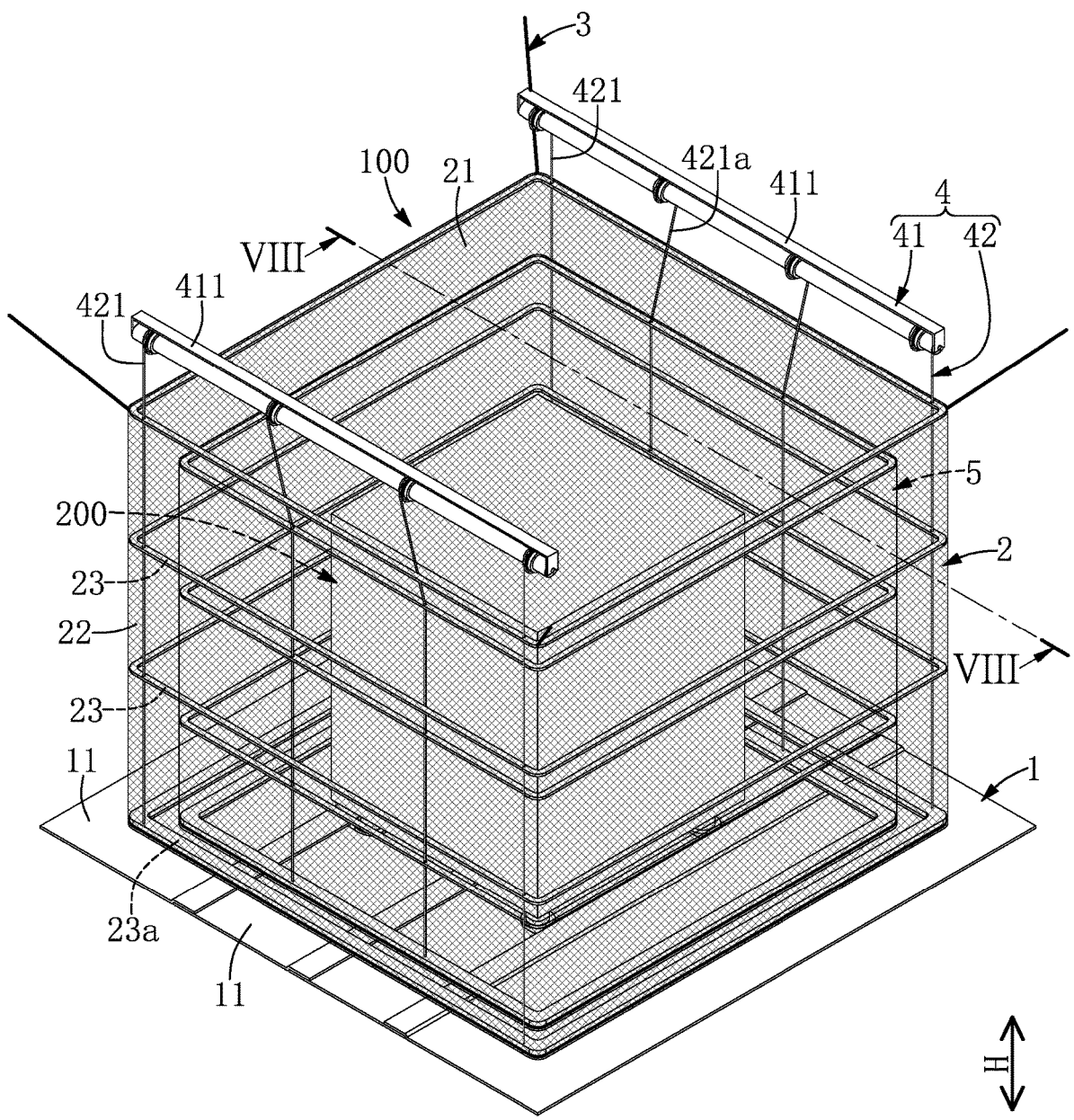
FIG. 7 is a perspective view of an external electromagnetic shielding device disposed outside of a test system according to a second embodiment of the present disclosure.
Figure 8:
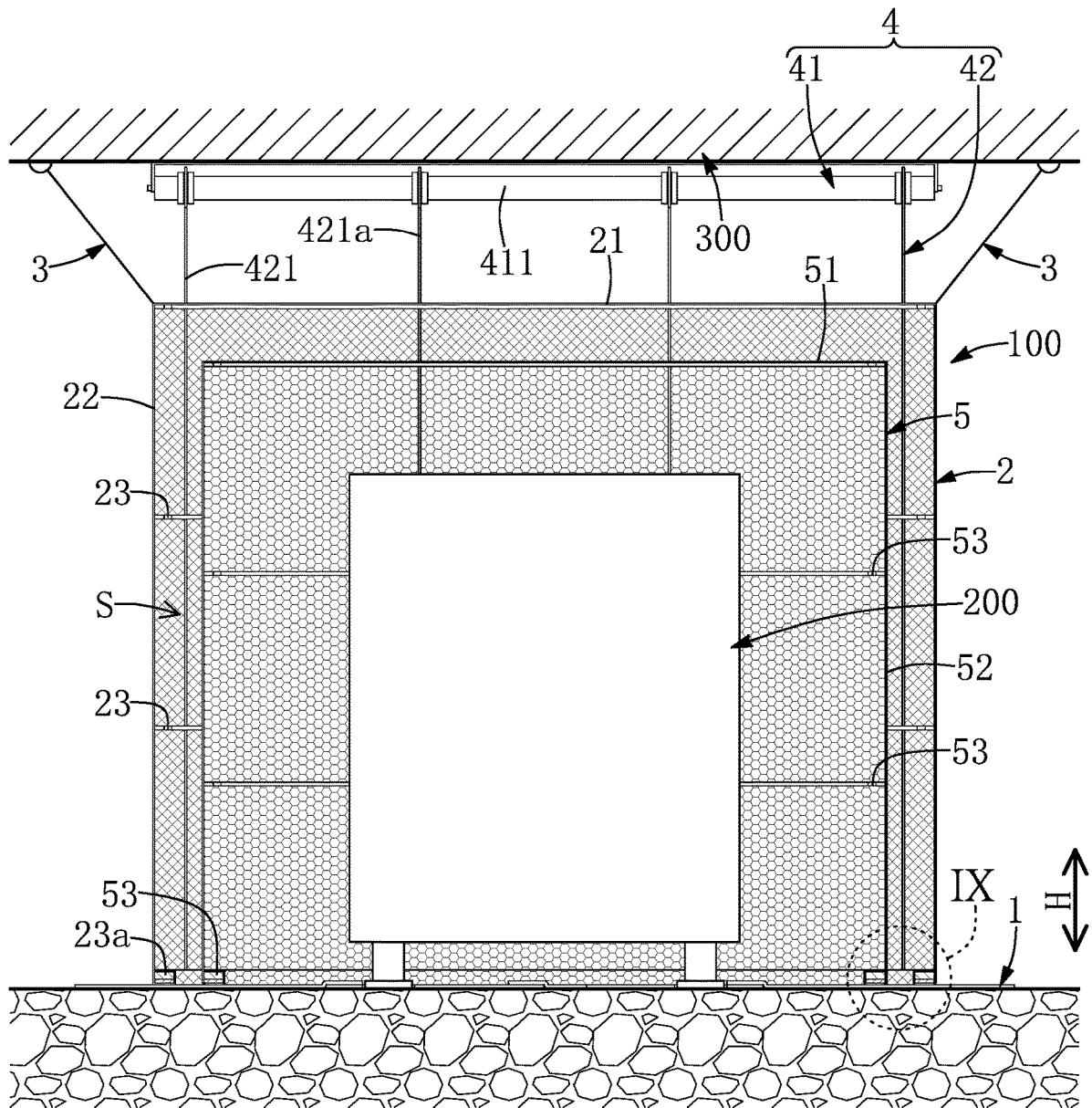
FIG. 8 is a cross-sectional view taken along line VIII-VIII of FIG. 7.
Figure 9:
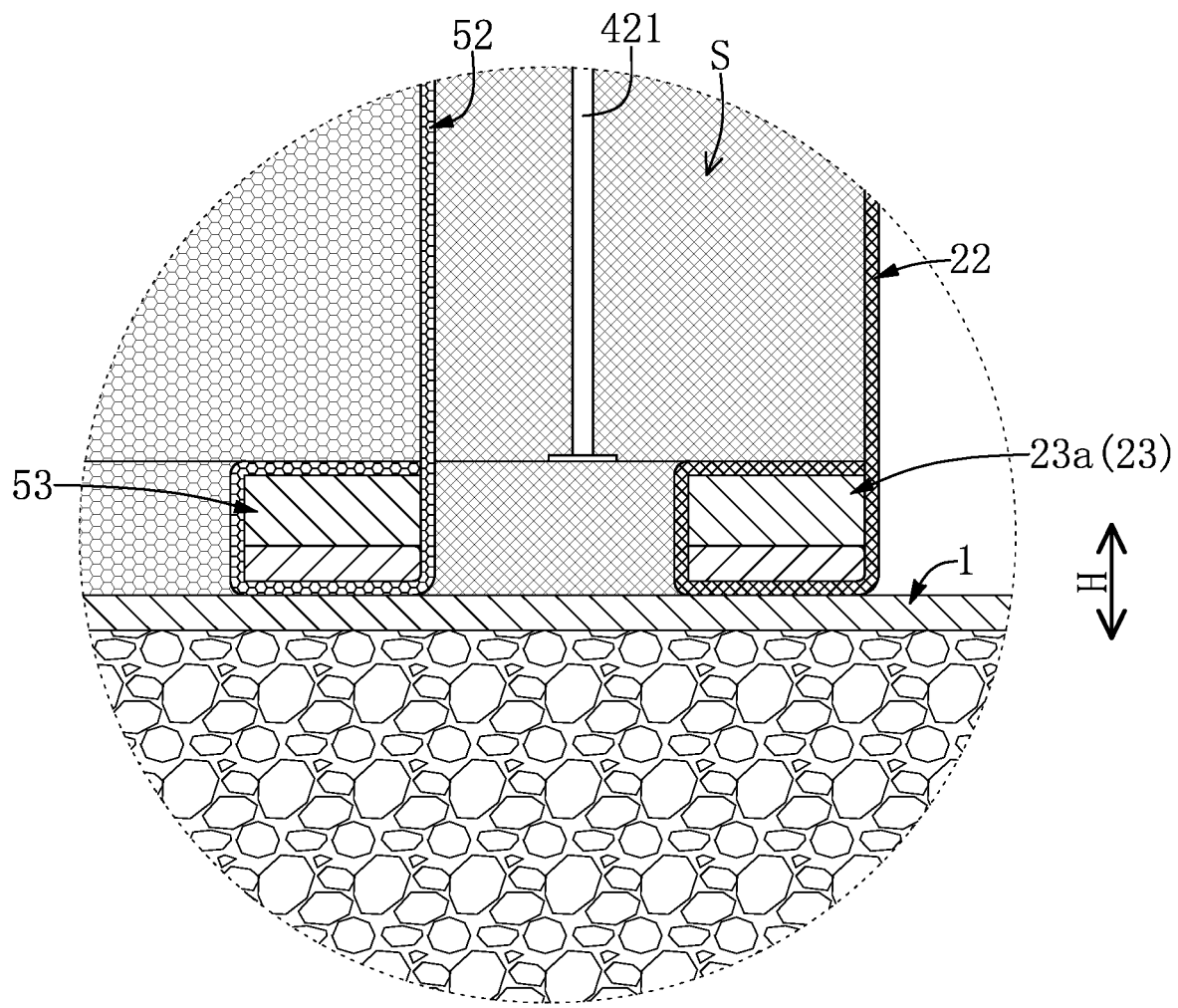
FIG. 9 shows an enlarged view of part IX of FIG. 8.
Figure 10:
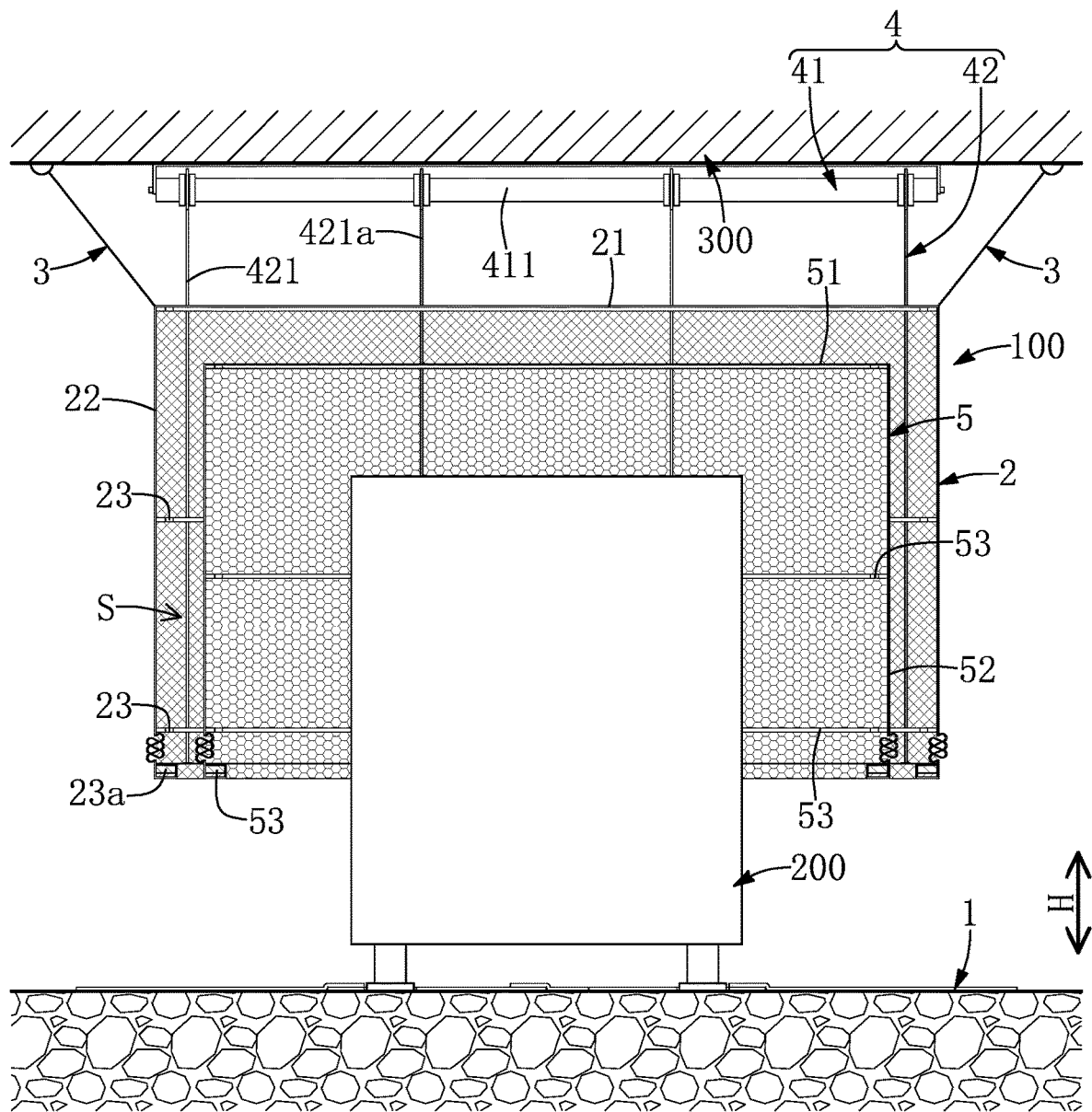
FIG. 10 is a cross-sectional view showing the conductive cover and an inner conductive cover of FIG. 8 being coiled.
Figure 11:
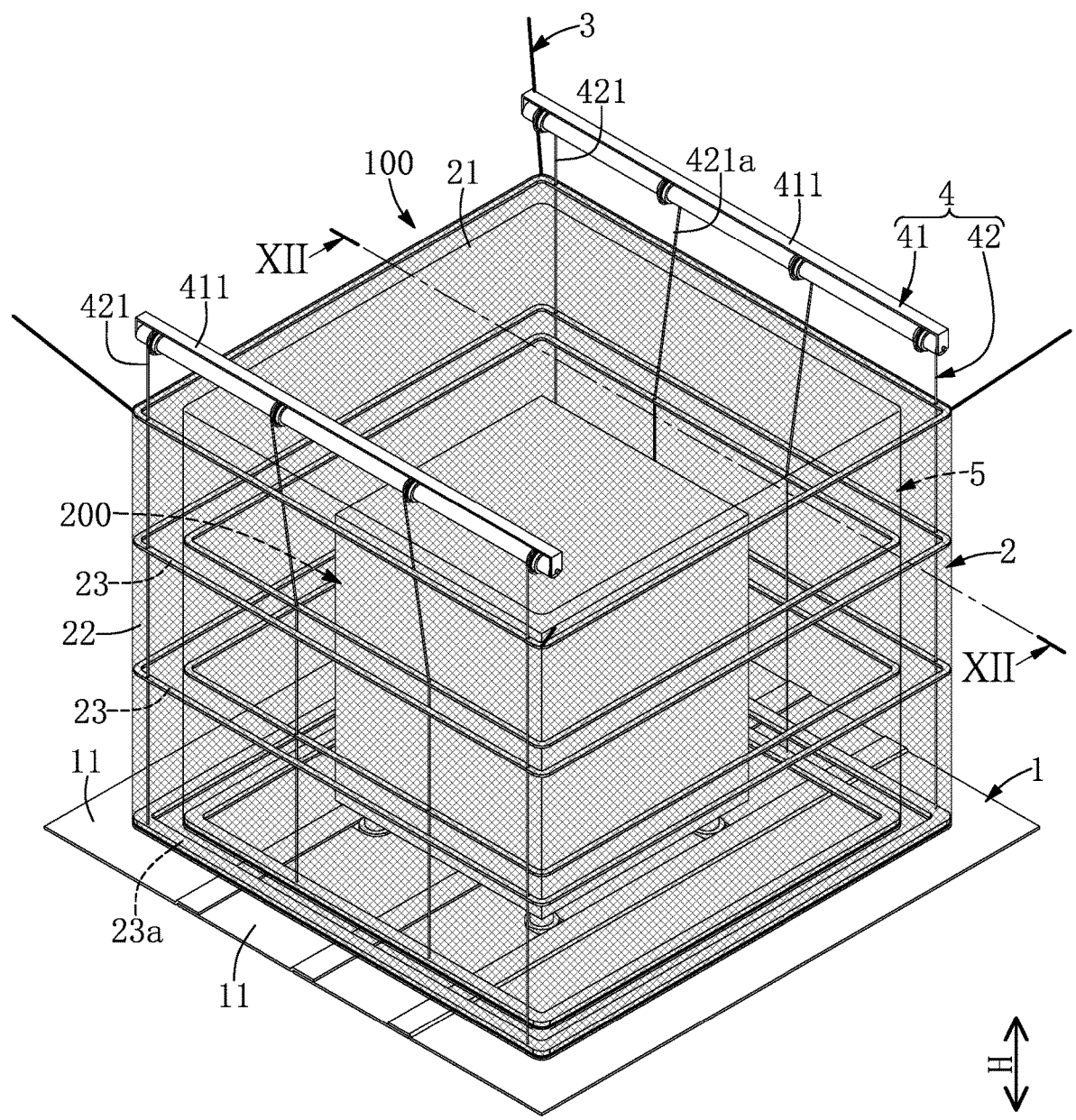
FIG. 11 is a perspective view showing the external electromagnetic shielding device in another configuration according to the second embodiment of the present disclosure.
Figure 12:
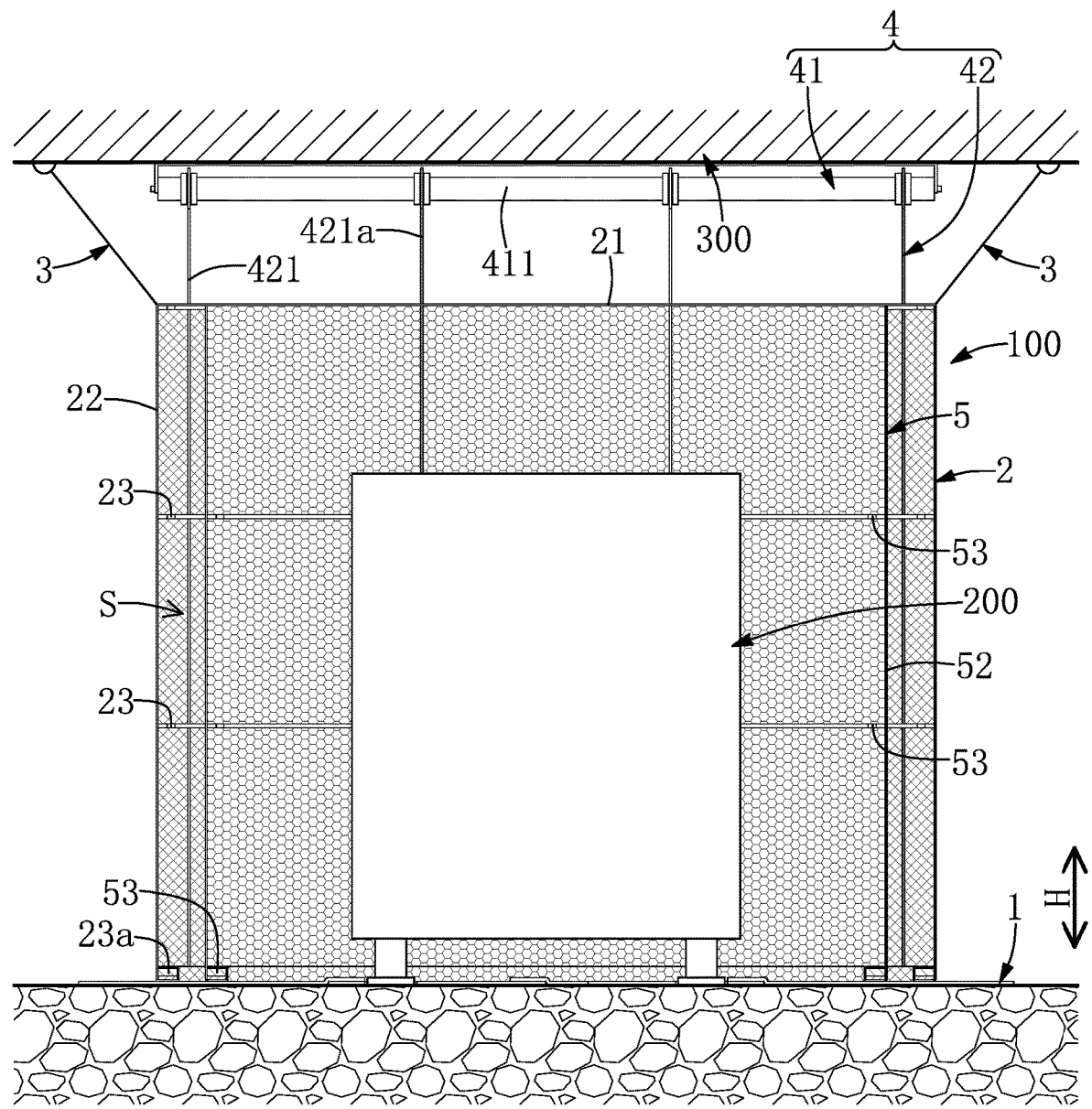
FIG. 12 is a cross-sectional view taken along line XII-XII of FIG. 11.
Figure 13:
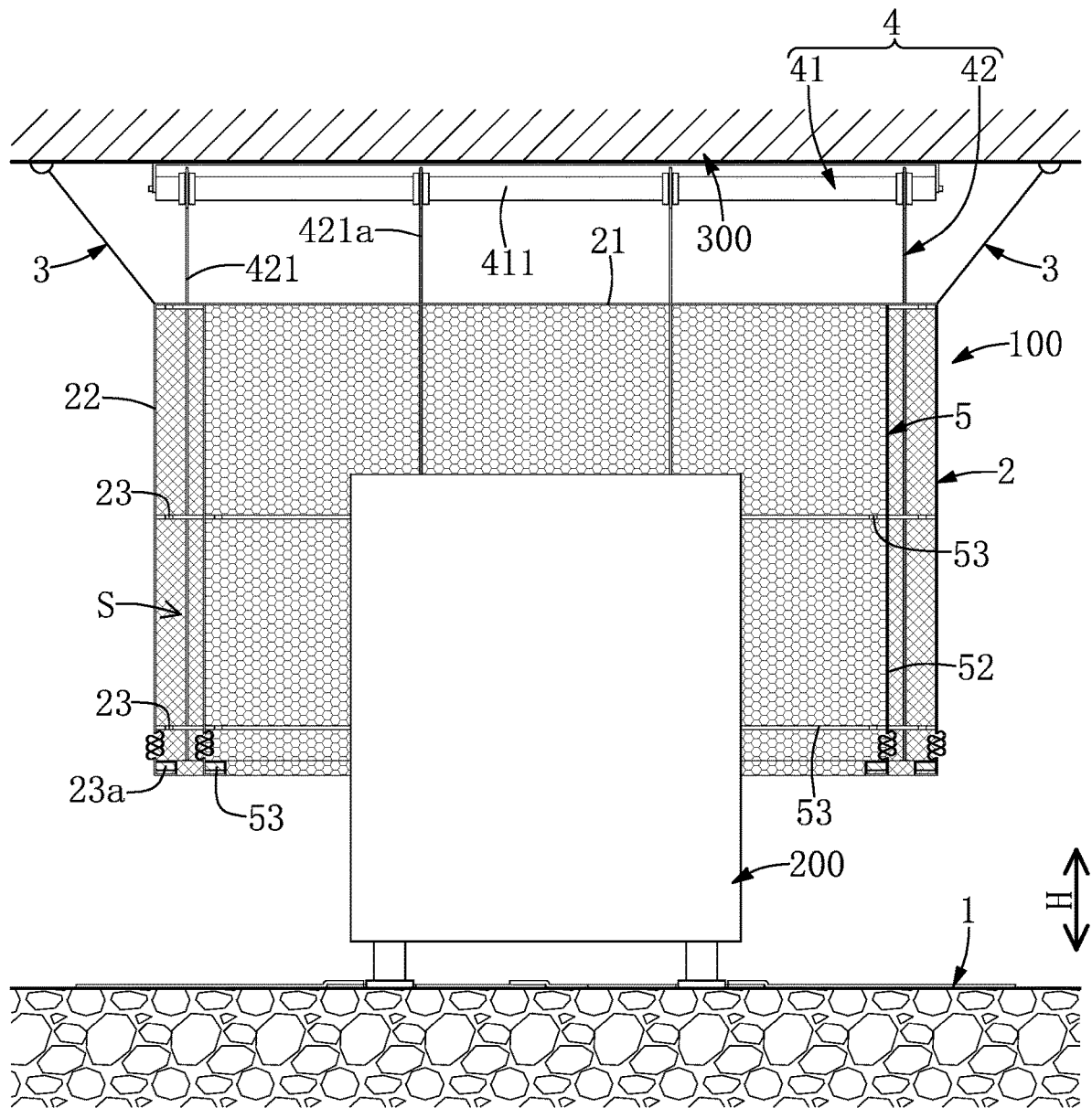
FIG. 13 is a cross-sectional view showing the conductive cover and the inner conductive cover of FIG. 12 being coiled.

Moreover, as shown in FIG. 2, FIG. 5, and FIG. 6, when the linkage unit 42 is coiled on or released from the rolling unit 41, the linkage unit 42 moves the bottom support 23a so as to allow the lateral shield 22 to fold or unfold between the bottom shield 1 and the top shield 21 along the height direction H. In other words, the bottom portion of the lateral shield 22 can be moved to a predetermined height by using the rolling module 4, thereby facilitating the operation and maintenance of the test system 200.

Accordingly, the external electromagnetic shielding device 100 in the present embodiment is configured to be disposed outside of the test system 200, thereby achieving a complete electromagnetic shielding effect to the test system 200. Moreover, the conductive cover 2 of the external electromagnetic shielding device 100 is in the grid-like shape to effectively maintain the heat dissipation efficiency of the test system 200 and to avoid affecting the operation of the test system 200.

Second Embodiment

Referring to FIG. 7 to FIG. 13, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, as shown in FIG. 7 to FIG. 10, the external electromagnetic shielding device 100 further includes an inner conductive cover 5 being in a grid-like shape. Moreover, a mesh number of the inner conductive cover 5 is within a range from 20 to 500. Accordingly, air inside and outside of the inner conductive cover 5 can circulate to improve a heat dissipation efficiency of the test system 200.

Moreover, a material of the conductive cover 2 is different from a material of the inner conductive cover 5. Specifically, one of the conductive cover 2 and the inner conductive cover 5 is a copper mesh, and another one of the conductive cover 2 and the inner conductive cover 5 is a conductive cloth, but the present disclosure is not limited thereto. For example, in other embodiments of the present disclosure not shown in the drawings, the material of the conductive cover 2 can be identical to the material of the inner conductive cover 5 (e.g., the conductive cover 2 and the inner conductive cover 5 are copper meshes or conductive cloths); or, the conductive cover 2 and the inner conductive cover 5 can be metal meshes other than the copper mesh.

The inner conductive cover 5 is arranged in the electromagnetic shielding space S, and is configured to surround and be spaced apart from the test system 200. The conductive cover 2 and the inner conductive cover 5 are connected to the rolling module 4. For example, the linkage unit 42 further includes a plurality of cords 421a respectively coiled on the rollers 411 and connected to the inner conductive cover 5, so that the linkage unit 42 can be connected to the inner conductive cover 5.

Specifically, the inner conductive cover 5 is arranged inside of the conductive cover 2 (or is arranged in the electromagnetic shielding space S) for further reinforcing the electromagnetic shielding effect to the test system 200, and the structure of the inner conductive cover 5 can be adjusted or changed according to design requirements.

For example, the structure of the inner conductive cover 5 can be completely compared to that of the conductive cover 2 (detail features will not be reiterated herein). In other words, the inner conductive cover 5 can be formed as a structure shown in FIG. 7 to FIG. 10, and includes an inner top shield 51, an inner lateral shield 52 connected to a peripheral edge of the inner top shield 51, and a plurality of inner supports 53 that are fixed to the inner lateral shield 52. Moreover, the structure of the inner conductive cover 5 can be not completely compared to that of the conductive cover 2. In other words, the inner conductive cover 5 can be formed as a structure shown in FIG. 11 to FIG. 13 that is provided without the inner top shield 51. Specifically, the inner conductive cover 5 can only include an inner lateral shield 52 that is connected to the top shield 21 and a plurality of inner supports 53 that are fixed to the inner lateral shield 52.

Accordingly, when the linkage unit 42 is coiled on or released from the rolling unit 41, the linkage unit 42 moves a bottom of the inner conductive cover 5 so as to allow the inner conductive cover 5 to fold or unfold along the height direction H. Specifically, the conductive cover 2 and the inner conductive cover 5 can simultaneously fold or unfold through the linkage unit 42, so that a user can easily manipulate the external electromagnetic shielding device 100 to perform an electromagnetic shielding function for the test system 200, but the present disclosure is not limited thereto.

In addition, the external electromagnetic shielding device 100 in the present embodiment is provided with the inner conductive cover 5 between the conductive cover 2 and the test system 200, but in other embodiments of the present disclosure not shown in the drawings, a quantity of the inner conductive cover 5 can be more than one and is not limited to the drawings of the present embodiment.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An external electromagnetic shielding device for being disposed outside of a test system, comprising:
   a bottom shield configured to be arranged under a bottom of the test system;
   a conductive cover being in a grid-like shape and arranged above the bottom shield, wherein the conductive cover includes:

a top shield spaced apart from the bottom shield along a height direction by a distance;

a lateral shield connected to the top shield, wherein the lateral shield, the top shield, and the bottom shield jointly define an electromagnetic shielding space; and a plurality of supports fixed to the lateral shield, wherein any two of the supports are spaced apart from each other along the height direction, and wherein the supports include a bottom support that is in an annular arrangement; and a rolling module including a rolling unit and a linkage unit that is connected to the rolling unit and the bottom support, wherein, when the linkage unit is coiled on or released from the rolling unit, the linkage unit moves the bottom support so as to allow the lateral shield to fold or unfold between the bottom shield and the top shield along the height direction.

2. The external electromagnetic shielding device according to claim 1, further comprising a hanging module connected to the top shield so as to allow the conductive cover to be hung at a predetermined position through the hanging module.

3. The external electromagnetic shielding device according to claim 1, wherein the rolling unit includes a plurality of rollers, the linkage unit includes a plurality of cords respectively coiled on the rollers, and ends of the cords away from the rollers are respectively fixed to different regions of the bottom support.

4. The external electromagnetic shielding device according to claim 1, wherein the bottom shield includes a plurality of splicing sheets that are spliced together to form the bottom shield, and the splicing sheets are configured to be detachably arranged under the bottom of the test system.

5. The external electromagnetic shielding device according to claim 4, wherein any two of the splicing sheets adjacent to each other partially overlap.

6. The external electromagnetic shielding device according to claim 1, further comprising an inner conductive cover being in a grid-like shape, wherein the inner conductive cover is arranged in the electromagnetic shielding space, and is configured to surround and be spaced apart from the test system.

7. The external electromagnetic shielding device according to claim 6, wherein the linkage unit is connected to the inner conductive cover, and wherein, when the linkage unit is coiled on or released from the rolling unit, the linkage unit moves a bottom of the inner conductive cover so as to allow the inner conductive cover to fold or unfold along the height direction.

8. The external electromagnetic shielding device according to claim 6, wherein a mesh number of the conductive cover is within a range from 20 to 500, and a mesh number of the inner conductive cover is within a range from 20 to 500.

9. The external electromagnetic shielding device according to claim 6, wherein a material of the conductive cover is different from a material of the inner conductive cover, one of the conductive cover and the inner conductive cover is a copper mesh, and another one of the conductive cover and the inner conductive cover is a conductive cloth.

10. The external electromagnetic shielding device according to claim 1, wherein the bottom support is surrounded by a bottom portion of the lateral shield and is configured to be magnetically connected to the bottom shield, so that the bottom shield and the bottom portion of the lateral shield are commonly grounded by being connected to each other.

11. An external electromagnetic shielding device, comprising:

a bottom shield;

a conductive cover being in a grid-like shape and arranged above the bottom shield, wherein the conductive cover includes:

a top shield spaced apart from the bottom shield along a height direction by a distance;

a lateral shield connected to the top shield, wherein the lateral shield, the top shield, and the bottom shield jointly define an electromagnetic shielding space; and a bottom support fixed to the lateral shield and being in an annular arrangement; and a rolling module including a rolling unit and a linkage unit that is connected to the rolling unit and the bottom support, wherein, when the linkage unit is coiled on or released from the rolling unit, the linkage unit moves the bottom support so as to allow the lateral shield to fold or unfold between the bottom shield and the top shield along the height direction.

12. The external electromagnetic shielding device according to claim 11, further comprising a hanging module connected to the top shield, so as to allow the conductive cover to be hung at a predetermined position through the hanging module.

13. The external electromagnetic shielding device according to claim 11, wherein the rolling unit includes a plurality of rollers, the linkage unit includes a plurality of cords respectively coiled on the rollers, and ends of the cords away from the rollers are respectively fixed to different regions of the bottom support.

14. The external electromagnetic shielding device according to claim 11, wherein the bottom shield includes a plurality of splicing sheets that are spliced together to form the bottom shield, and any two of the splicing sheets adjacent to each other partially overlap.

15. The external electromagnetic shielding device according to claim 11, wherein a mesh number of the conductive cover is within a range from 20 to 500.

* * * * *